(12) United States Patent
Yamauchi et al.

(10) Patent No.: US 7,947,339 B2
(45) Date of Patent: May 24, 2011

(54) PROCESS FOR PRODUCING ELECTROPHOTOGRAPHIC ROLLER MEMBER

(75) Inventors: Kenichi Yamauchi, Susono (JP); Hidenori Satoh, Odawara (JP); Genya Anan, Numazu (JP)

(73) Assignee: Canon Kabushiki Kaisha, Tokyo (JP)

( * ) Notice: Subject to any disclaimer, the term of this patent is extended or adjusted under 35 U.S.C. 154(b) by 16 days.

(21) Appl. No.: 12/260,906

(22) Filed: Oct. 29, 2008

(65) Prior Publication Data

US 2009/0061109 A1 Mar. 5, 2009

Related U.S. Application Data

(63) Continuation of application No. PCT/JP2008/058305, filed on Apr. 23, 2009.

(30) Foreign Application Priority Data

Apr. 27, 2007 (JP) ................. 2007-118783

(51) Int. Cl.
H05H 1/24 (2006.01)
(52) U.S. Cl. .................. 427/579; 427/578; 427/569
(58) Field of Classification Search .................. 427/569, 427/578, 579
See application file for complete search history.

(56) References Cited

U.S. PATENT DOCUMENTS

| 4,560,634 | A | * | 12/1985 | Matsuo et al. | 430/84 |
| 6,463,250 | B1 | * | 10/2002 | Chen et al. | 399/330 |
| 6,861,373 | B2 | * | 3/2005 | Aoki et al. | 438/761 |
| 2007/0111872 | A1 | | 5/2007 | Nakamura et al. | 492/53 |

FOREIGN PATENT DOCUMENTS

| JP | 58-158929 | | 9/1983 |
| JP | 01-144078 | | 6/1989 |
| JP | 01-257970 | | 10/1989 |
| JP | 09212004 | A * | 8/1997 |
| JP | 2002-173599 | | 6/2002 |
| JP | 2004-177469 | | 6/2004 |
| JP | 2005-157040 | | 6/2005 |
| JP | 2006-235045 | | 9/2006 |
| JP | 2006-258934 | | 9/2006 |

(Continued)

OTHER PUBLICATIONS

English translation of JP 09-212004.*

(Continued)

*Primary Examiner* — Timothy H Meeks
*Assistant Examiner* — Collette Ripple
(74) *Attorney, Agent, or Firm* — Fitzpatrick, Cella, Harper & Scinto (57) ABSTRACT

A process for producing an electrophotographic roller member comprising a roller base member having a conductive mandrel and an elastic layer, and a film on the elastic layer. The process comprises the step of forming the film by plasma CVD. The step comprises the steps of: placing the roller base member in a chamber in such a way that the distance between the surface of the elastic layer and flat-plate electrodes is 20 mm or more to 100 mm or less; feeding a source gas into the chamber so as to have a pressure of from 13.3 Pa or more to 666.6 Pa or less; and applying to an electrode an electric power of from 0.3 W/cm² or more to 2.0 W/cm² or less while rotating the roller base member so that the peripheral speed of from 6 mm/s or more to 170 mm/s or less.

5 Claims, 3 Drawing Sheets

FOREIGN PATENT DOCUMENTS

JP 2007-010764 1/2007

OTHER PUBLICATIONS

Englinsh translation of JP 09-212004, which was filed on Aug. 1997.*

International Preliminary Report on Patentability in PCT/JP2008/058305, along with English-language translation, dated Nov. 5, 2009—13 pages.

Official Action dated Mar. 14, 2011 in Chinese Application No. 200880013492.0.

* cited by examiner

PROCESS FOR PRODUCING ELECTROPHOTOGRAPHIC ROLLER MEMBER

This application is a continuation of International Application No. PCT/JP2008/058305 filed on Apr. 23, 2008, which claims the benefit of Japanese Patent Application No. 2007-118783 filed on Apr. 27, 2007.

BACKGROUND OF THE INVENTION

1. Field of the Invention

This invention relates to an electrophotographic roller member (hereinafter also simply "roller member") used in, e.g., developing rollers which carry toners thereon, used in electrophotographic image forming apparatus.

2. Description of the Related Art

Conventionally, electrophotographic image forming apparatus such as copying machines and laser printers have developing rollers.

In the electrophotographic image forming apparatus, a contact developing system with a non-magnetic one-component toner and a non-contact developing system with a magnetic one-component toner are in wide use. The contact developing system is a system in which a non-magnetic toner is coated on a developing roller by means of an elastic blade or the like and a voltage is applied in the state the developing roller and a photosensitive drum are in contact with each other, to make the toner move to electrostatic latent images formed on the photosensitive drum to perform development. The non-contact developing system is a system in which a magnetic toner is bound onto a developing roller by magnetic force of a built-in magnet and the level of the toner is controlled by a control means, where a voltage is applied in the state the developing roller and a photosensitive drum are not in contact with each other, to make the toner fly to electrostatic latent images formed on the photosensitive drum to perform development.

For example, in the contact developing system, the non-magnetic toner is transported to a developing zone in the state it is carried on the surface of the developing roller, which is rotated in contact with the photosensitive drum. Then, in that contact zone, the non-magnetic toner moves from the developing roller to the photosensitive drum in accordance with a pattern of the electrostatic latent images. Where the developing roller is a cylindrical drum of popular use, a conductive rubber roller having a mandrel and formed on its peripheral surface a conductive elastic layer is usually used as the developing roller, in order to secure a stable contact width between it and the photosensitive drum.

In such a conductive rubber roller, it is well known that, in order to prevent the elastic layer from wearing and prevent the toner from adhering to the surface of the developing roller to cause filming, a single-layer or multiple-layer film is further formed on the elastic layer. As one of methods for forming such a film, Japanese Patent Laid-open Application No. 2007-010764 discloses a developing roller having a good dimensional precision, a cover layer of which is formed by dip coating.

However, where a film is formed by coating, it is usually necessary to provide the step of drying and hardening a wet coating. Where it is necessary to heat it in such a drying step, materials for the elastic layer are required to have heat resistance. Hence, the materials for the elastic layer may inevitably be limited. Also, where a solvent is used, it may take much time and labor to deal with the solvent after use.

Meanwhile, Japanese Patent Laid-open Application No. H01-257970 discloses a toner carrying member having on its surface a film comprising a semi-conductive layer formed of a ceramic having a specific resistance of from $10^4 \Omega \cdot cm$ or more to $10^{12} \Omega \cdot cm$ or less, which is formed by plasma spray coating and is further subjected to sealing treatment. Japanese Patent Laid-open Application No. H01-144078 also discloses a toner carrying member having a ceramic coating layer of from 0.1 µm to 5.0 µm in a thickness, formed by coating carried out in the presence of plasma formed; the layer being formed by plasma CVD or the like. However, both the above Japanese Patent Laid-open Applications No. H01-257970 and No. H01-144078 disclose formation of the film on a substrate made of stainless steel or aluminum, and neither disclose nor suggest any formation of the film on the surface of an elastic layer.

As the electrophotographic image forming apparatus have been made high-minuteness and high-speed in recent years, the electrophotographic roller member has also come to be required to have performance in a higher grade. In particular, the roller member is required to be much more improved in dimensional precision such as roundness (cylindricality). Accordingly, as a method of forming a film, the present inventors have repeatedly made studies on formation of a film on an elastic layer by the plasma CVD disclosed in the above Japanese Patent Laid-open Application No. H01-144078. As the result, they have come to a finding of film forming conditions which are favorable for forming a cover layer on the elastic layer by plasma CVD to obtain an electrophotographic roller member having a high dimensional precision.

SUMMARY OF THE INVENTION

An object of the present invention is to provide a process for producing an electrophotographic roller member having a high dimensional precision.

According to one aspect of the present invention, there is provided a process for producing an electrophotographic roller member comprising a roller base member having a conductive mandrel and an elastic layer formed on the peripheral surface of the conductive mandrel, the elastic layer having a thickness of from 0.5 mm or more to 5.0 mm or less and a modulus in tension of from 1 MPa or more to 100 MPa or less, the process comprising the step of forming a film by plasma CVD on the peripheral surface of the elastic layer, wherein the step comprises the steps of: placing the roller base member in a chamber between first and second flat-plate electrodes which are disposed in parallel to each other, in such a way that the distance between the surface of the elastic layer and each of the flat-plate electrodes is 20 mm or more to 100 mm or less; feeding a source gas into the chamber so as to have a pressure of from 13.3 Pa or more to 666.6 Pa or less; and applying to the first flat-plate electrode an electric power with an output of from 0.3 W/cm$^2$ or more to 2.0 W/cm$^2$ or less while the roller base member is rotated so that the peripheral speed of the surface to be processed comes to from 6 mm/s or more to 170 mm/s or less in the chamber into which the source gas has been fed, thereby generating plasma inside the chamber, and forming a film on the surface of the elastic layer.

According to the present invention, a high-quality electrophotographic roller member can be produced which is usable as a developing roller or the like as having a high roundness, a superior dimensional stability and less film non-uniformity.

Further features of the present invention will become apparent from the following description of exemplary embodiments with reference to the attached drawings.

DESCRIPTION OF THE EMBODIMENTS

The process for producing a developing roller as an example of the electrophotographic roller member according to the present invention is described below in detail, giving examples.

Figure 2:
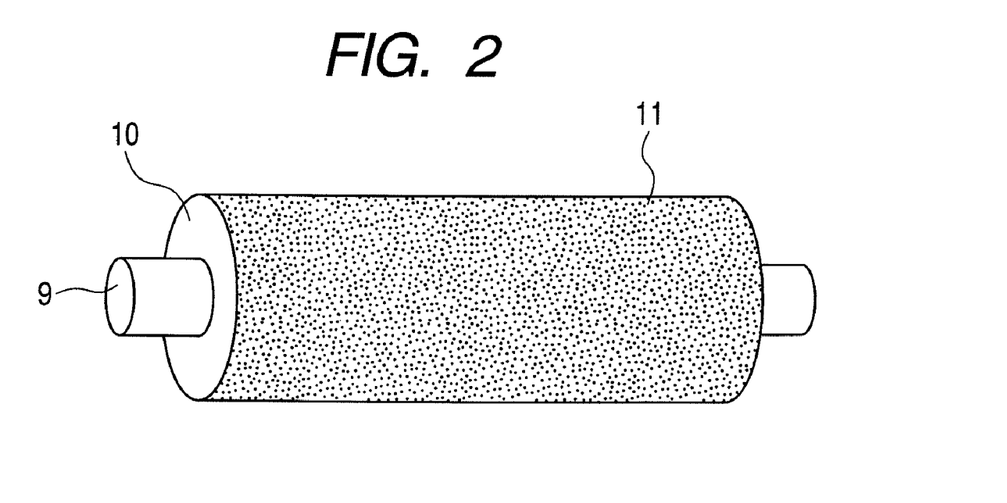
FIG. 2 is a diagrammatic view schematically showing the construction of an example of the developing roller produced by the process of the present invention.

A schematic sectional view in the direction falling at right angles with the shaft of the developing roller according to the present invention is shown as FIG. 2. As shown in FIG. 2, the electrophotographic roller member according to the present invention has a conductive mandrel 9, an elastic layer 10 provided on the peripheral surface of the mandrel, and a film 11 formed by plasma CVD on the peripheral surface of the elastic layer 10.

The elastic layer 10 has a thickness of from 0.5 mm or more to 5.0 mm or less, and has a modulus in tension of from 1 MPa or more to 100 MPa or less.

In the present invention, there are no particular limitations on how to provide the elastic layer 10 on the peripheral surface of the conductive mandrel 9. It may be provided by any method such as extrusion, injection molding or cast molding, which is conventionally known in the art.

There are no particular limitations on the layer make-up of the elastic layer as long as it has the characteristic features described in the present invention. It may be made up of a single layer, or may be made up of two or more layers.

As the conductive mandrel 9 used in the present invention, any of mandrels may be used which are conventionally used in the developing roller of this type.

A material which makes up the conductive mandrel 9 may include, as specific examples thereof, the following.

Copper, aluminum, titanium, nickel, and alloy steels containing any of these metals (e.g., stainless steel such as SUS or SUM, duralmin, brass, and bronze; and resins mixed with carbon black or carbon fiber.

Here, the alloy steel may include stainless steel, nickel chromium steel, nickel chromium molybdenum steel, chromium steel, chromium molybdenum steel, and nitriding steel to which Al, Cr, Mo and V have been added. Of these, those made of metal are preferred from the viewpoint of strength. The conductive mandrel may further be subjected to plating or oxidizing treatment as a measure for rust prevention. As the shape of the conductive mandrel 9, a rod-like one or a pipe-like one may be used. If necessary, a primer-treated layer may be formed on its surface. This conductive mandrel may usually have outer diameter within the range of from 4 mm to 20 mm.

The elastic layer has a thickness of from 0.5 mm or more to 5.0 mm or less. Inasmuch as its thickness is within the above range, the elastic layer may be controlled with ease in its molding, and this is advantageous to improvement in dimensional precision of the developing roller. To find the thickness of the elastic layer, the radius of the conductive mandrel 9 may be subtracted from the radius of the roller base member. The thickness of the elastic layer 10 may be measured with a three-dimensional coordinate measuring instrument (trade name: ZAIZAX RVF 600A; manufactured by Tokyo Seimitsu Co., Ltd.) or the like.

The elastic layer 10 is also required to have a modulus in tension of from 1 MPa or more to 100 MPa or less. Inasmuch as the elastic layer has a modulus in tension within the above range, the developing roller can be kept from being deformed in excess during the contact development. It also may give no excess mechanical stress to the toner. Hence, the toner can be kept from melt-adhering to the developing roller surface, and the toner can be kept from any deterioration with time, such as come-off of external additives from toner particle surfaces.

The modulus in tension of the elastic layer 10 may be measured by the method prescribed in JIS K 7113.

Figure 5A:
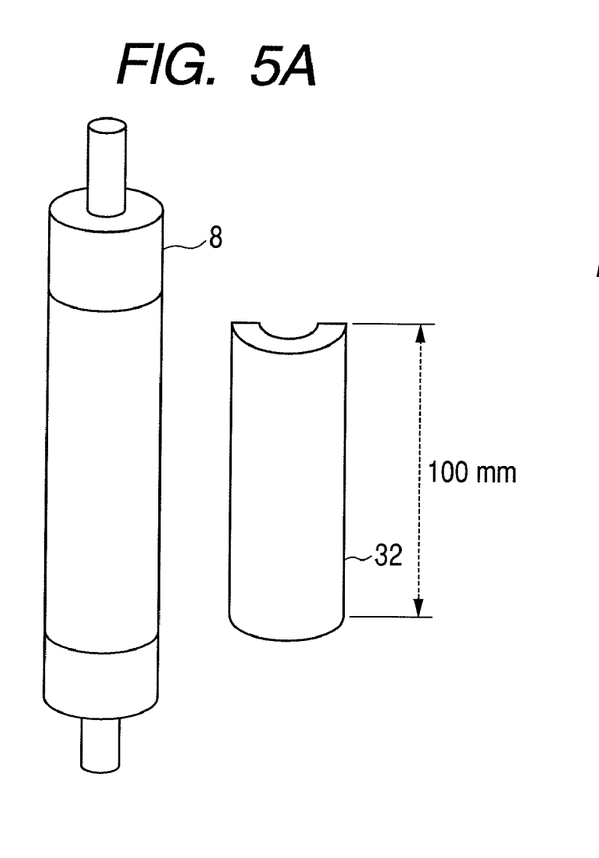
FIG. 5A is a perspective view showing the shape of a test sample used in measuring the modulus in tension, having been cut out of the elastic layer of a roller base member.

Stated specifically, a test sample obtained by sampling the elastic layer of the roller base member is attached to chucks of a tensile tester, and a tensile test may be conducted under conditions of a chuck-to-chuck length of 80 mm and a measuring rate of 20 mm/min and in a measuring environment of a temperature of 20° C. and a relative humidity of 50% to make measurement. In the present invention, a roller half-circumference part of an elastic layer of 100 mm in length, having been cut out of the elastic layer of the roller base member and having the shape shown in FIG. 5A, is used as a test sample 32. As the tensile tester, TENSILON RTC-1250A (trade name; manufactured by Orientec Co., Ltd.) may be used, for example.

Further, the elastic layer 10 may preferably be one having a coefficient of linear expansion of from $0.5 \times 10^{-4}/°$ C. or more to $5.0 \times 10^{-4}/°$ C. or less. Inasmuch as it has a coefficient of linear expansion of $0.5 \times 10^{-4}/°$ C. or more, the developing roller can have rubbing force in a preferably range to enable any external additives from coming off the toner particles and any wax from leaking out of them. This enables prevention of the toner from deterioration, and any fog from occurring when images are formed. Also, inasmuch as it has a coefficient of linear expansion of $5.0 \times 10^{-4}/°$ C. or less, the developing roller can be small in any dimensional changes depending on service environments to enable any faulty images to be kept from occurring. That is, making the elastic layer have a coefficient of linear expansion of from $0.5 \times 10^{-4}/°$ C. or more to $5.0 \times 10^{-4}/°$ C. or less enables production of a developing roller having more superior image forming performance.

Figure 5B:
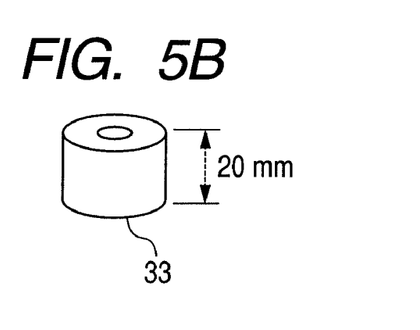
FIG. 5B is a perspective view showing the shape of a test sample used in measuring the coefficient of linear expansion, having been cut out of the elastic layer of a roller base member.

The coefficient of linear expansion of the elastic layer 10 may be measured with, e.g., a thermomechanical analyzer. Stated specifically, a test sample obtained by sampling the elastic layer of the roller base member is attached to the thermomechanical analyzer, and is heated from 23° C. to 50° C. at a heating rate of 5° C./min in an atmosphere of nitrogen, where the coefficient of linear expansion may be determined from the thermal linear-expansion curve obtained. In the present invention, an elastic layer of 20 mm in length, having been cut out of the elastic layer of the roller base member and having the shape shown in FIG. 5B is used as a test sample 33. As the thermomechanical analyzer, TMA-60 (trade name; manufactured by Shimadzu Corporation) may be used, for example.

There are no particular limitations on a material used for the elastic layer in the present invention. Usually, it may preferably be a thermoplastic resin or a rubber.

Specific examples of the thermoplastic resin are enumerated below. Polyethylene type resins (such as low-density polyethylene, high-density polyethylene, straight-chain low-density polyethylene and an ethylene-vinyl acetate copolymer resin), polypropylene type resins, acrylonitrile-butadiene-styrene resin, polyamide resins, polycarbonate resins, polystyrene type resins, polyimide, polyethylene terephthalate, polybutylene terephthalate, fluorine resins, polyamide resins (such as polyamide 6, polyamide 66 and MXD 6), polyolefin type elastomers, styrene type elastomers and polyester type elastomers. Any of these thermoplastic resins may be used alone, or in combination of two or more.

Specific examples of the rubber are enumerated below. Styrene-butadiene rubber, acrylonitrile-butadiene rubber, epichlorohydrin rubber, isoprene rubber, isobutylene-isoprene rubber, ethylene-propylene rubber (EPR), an ethylene-propylene-diene terpolymer (EPDM), chloroprene rubber, acrylic rubbers, natural rubbers and fluorine rubbers. Any of these rubbers may be used alone, or in combination of two or more.

The thermoplastic resin or a thermoplastic resin composition may less contain additives than the rubber, and hence, when the elastic layer has been formed, any low molecular weight substance may less exude from the elastic layer. Thus, it is more preferable as a constituent material of the elastic layer 10. In particular, an elastic layer formed of a dynamically cross-linked thermoplastic resin composition is preferred because it exhibits superior set properties. Inasmuch as the elastic layer has superior set properties, the developing roller can not easily cause any compression set such as concavities at the part of its contact with the photosensitive drum or control blade, and may by no means affect image formation even where its use has been stopped over a long period of time. The dynamically cross-linked thermoplastic resin composition is a resin in which a cross-linked rubber component has been micro-dispersed in a thermoplastic resin matrix. It may include, as specific examples thereof, the following.

Polypropylene in which cross-linked particles of an olefinic rubber such as EPDM or EPR have been micro-dispersed; and a resin in which cross-linked particles of a styrene-ethylene-butadiene-styrene block copolymer (SEBS), a styrene-ethylene-propylene-styrene block copolymer (SEPS) or a styrene-isoprene-styrene copolymer (SIS) have been micro-dispersed.

Any known various additives such as a conducting agent, a filler, an extending agent, an antioxidant or aging preventive agent, a processing aid, a vulcanizing agent, a vulcanization accelerator and an anti-scorching agent may further optionally be added to the elastic layer 10.

For example, the conducting agent may include the following.

Salts of Group 1 metals of the periodic table, such as $LiCF_3SO_3$, $NaClO_4$, $LiClO_4$, $LiAsF_6$, $LiBF_4$, NaSCN, KSCN and NaCl; ammonium salts such as $NH_4C_1$, $NH_4SO_4$ and $NH_4NO_3$; salts of Group 2 metals of the periodic table, such as $Ca(ClO_4)_2$ and $Ba(ClO_4)_2$; complexes of any of these salts with a polyhydric alcohol such as 1,4-butanediol, ethylene glycol, polyethylene glycol, propylene glycol or polypropylene glycol or with a derivative of any of these; complexes of any of these salts with a monool such as ethylene glycol monomethyl ether, ethylene glycol monoethyl ether, polyethylene glycol monomethyl ether or polyethylene glycol monoethyl ether; cationic surface-active agents such as quaternary ammonium salts; anionic surface-active agents such as aliphatic sulfonates, alkyl sulfuric ester salts and alkyl phosphoric ester salts; amphoteric surface-active agents such as betaine; and suitable particles to the surfaces of which a metal such as aluminum, gold, silver, copper, chromium, cobalt, iron, lead, platinum or rhodium has been adhered by electrolytic treatment, spray coating or mixing shaking, and carbon black type conducting agents.

The carbon black type conducting agents may include acetylene black, KETJEN BLACK, PAN type carbon black, pitch type carbon black, and carbon nanotubes.

Of these conducting agents, the above carbon black type conducting agents are particularly preferred in view of performance, quality and cost.

Specific examples of the filler and extending agent are enumerated below. Silica, fine quartz powder, diatomaceous earth, zinc oxide, basic magnesium carbonate, activated calcium carbonate, magnesium silicate, aluminum silicate, titanium dioxide, talc, mica powder, aluminum sulfate, calcium sulfate, barium sulfate, glass fiber, organic reinforcing agents, and organic fillers. Particle surfaces of these fillers may be treated with an organosilicon compound or the like to make them hydrophobic. Without limitation to these, any known materials may also be used.

The antioxidant may include hindered phenol type antioxidants, phenol type antioxidants, phosphorous type antioxidants, amine type antioxidants and sulfur type antioxidants, which are known materials used for polymeric compounds.

As the processing aid, any known material may be used, and may include fatty acids such as stearic acid and oleic acid, and metal salts or esters of the fatty acids.

Before the film is formed on the peripheral surface of the roller base member, the peripheral surface of the elastic layer may be modified by any known surface-modifying method such as corona treatment, flame treatment or excimer UV treatment in order to improve adhesion so that the film may not come off the elastic layer.

The step of forming the film by plasma CVD on the peripheral surface of the elastic layer of the roller base member is described next with reference to FIG. 1.

-Step (1)-

First, a high-frequency plasma CVD system is readied. This high-frequency plasma CVD system has a chamber 7, as shown in FIG. 1. A source gas feeder 1, a rare-gas feeder 2, a pair of flat-plate electrodes (a first flat-plate electrode 301 and a second flat-plate electrode 303), a high-frequency power source 4 connected to the first flat-plate electrode 301, an evacuation unit 5 and a rotating unit 6 are attached to the chamber 7. The first and second flat-plate electrodes 301 and 303 are placed in parallel to each other. There are no particular limitations on the shapes of the flat-plate electrodes 301 and 302, which may usually preferably be rectangular. Between these flat-plate electrodes, a roller base member 8 is placed in the state it is connected to the rotating unit 6. The roller base member 8 may usually preferably be placed at the center position between the flat-plate electrodes and also in parallel to the surfaces of the flat-plate electrodes. Where a plurality of roller base members are placed, they may preferably be so placed that the distances between the flat-plate electrodes and the respective roller base members may be equal to each other. The high-frequency power source 4 is connected to one of the flat-plate electrodes 301 and 303. The pair of the flat-plate electrodes 301 and 303 may optionally be provided with a cooling means making use of water, air, liquid nitrogen or the like.

As to the frequency of the high-frequency power source used in the high-frequency plasma CVD system, there are no particular limitations thereon as long as plasma discharge can be made, and the frequency may preferably be set within the range of from 0.1 KHz to 5.0 GHz, and particularly from 13.56 MHz to 108 MHz. Inasmuch as it is within this range, the plasma generated in the chamber can be in a stable condition, and hence more uniform film can be formed.

Next, the roller base member 8 is rotatably placed between the flat-plate electrode 301 and the flat-plate electrode 303. Here, the distance between the flat-plate electrode 301, to which the electric power is applied, and the surface of the elastic layer of the roller base member is set to be 20 mm or more to 100 mm or less. If this distance is less than 20 mm, the film may non-uniformly be formed. If it is more than 100 mm, the film may be formed in a low performance to cause bleeding or the like.

-Step (2)-

A source gas is fed into the chamber so as to have a pressure of from 13.3 Pa or more to 666.6 Pa or less. Inasmuch as the pressure of the source gas is set within the above range, the plasma can stably be generated in the chamber in connection with the other conditions. As the result, a uniform film can be formed on the elastic layer.

-Step (3)-

An electric power having an output of from 0.3 W/cm$^2$ or more to 2.0 W/cm$^2$ or less is applied to the first flat-plate electrode 301 while the roller base member is rotated in the chamber into which the source gas has been fed, being so rotated that the peripheral speed of the surface of the elastic layer comes to from 6 mm/s or more to 170 mm/s or less. Then, plasma is generated inside the chamber 7 to form a film on the surface of the elastic layer 10.

Thus, the formation of the film in the present invention is carried out by what is called a high-frequency plasma CVD (chemical vapor deposition) process. The high-frequency plasma CVD process is a process in which a source gas is made into plasma by the aid of a high-frequency power to make the source gas into radicals and the radicals are allowed to react to make them stable to deposit on the processing surface a film composed of the reaction product.

Making the source gas into plasma is carried out by glow discharge. Known as methods for the glow discharge are a method in which direct glow discharge is utilized, a method in which high-frequency glow discharge is utilized, a method in which microwave discharge is utilized, and so forth. The present invention is what utilizes direct glow discharge. The plasma CVD utilizes decomposition of the source gas by the aid of high-velocity electrons, and hence enables dissociation of a source gas having a large energy of formation. The plasma having been formed stands thermal non-equilibrium where the electron temperature and the gas temperature are different, and has an advantage that a relatively uniform film can be formed even where the processing surface of the roller base member has a low temperature.

The output per unit area of the flat-plate electrode in the present invention is from 0.3 W/cm$^2$ or more to 2.0 W/cm$^2$ or less. If this output is smaller than 0.3 W/cm$^2$, the plasma may come into so unstable condition that there is a possibility of causing non-uniformity in the film. If on the other hand this output is larger than 2.0 W/cm$^2$, the surface of the roller base member may come to be damaged, to cause deformation unwontedly, resulting in a low dimensional stability and a low outer-diameter precision in some cases. Incidentally, the area of electrode in the present invention is meant by the total area of one set of flat-plate electrodes placed in parallel. The one set of flat-plate electrodes in the present invention may both preferably have the same area.

The roller base member is so rotated that the peripheral speed of the processing surface in forming the film on the roller base member in the present invention comes to from 6 mm/s or more to 170 mm/s or less. If the peripheral speed of the processing surface is lower than 6 mm/s, the film may have a non-uniform thickness. If it is higher than 170 mm/s, the inertia on the peripheral surface of the elastic layer may acts so largely that the roller base member may deform to result in a low dimensional stability and a low outer-diameter precision in some cases.

The source gas used in the high-frequency plasma CVD system may include the following.

Gasifyable silicon hydrides (silanes) such as $SiH_4$; silane derivatives substituted with a halogen, such as $SiH_2Cl_2$ and $SiH_2F_2$; silicon halides such as $SiF_4$, $Si_2F_6$, $SiCl_4$ and $SiBr_4$; siloxanes such as hexamethyldisiloxane; boranes such as $B_2H_6$; halogen gases such as fluorine, chlorine, bromine and iodine; halogen compounds such as BrF, ClF, $ClF_5$, $BrF_5$ and IBr; hydrogen gas; hydrogen halides such as HF, HCl, HBr and HI; gaseous or gasifyable hydrocarbon compounds such as $CH_4$, $C_2H_6$, $C_3H_8$, $C_4H_{10}$, $C_2H_2$ and $C_6H_6$; and halides such as $CF_4$.

The film in the present invention is film formed by using any of these source gases. As a preferable film, it may include films composed chiefly of SiOx, films composed of diamond-like carbon (also often "DLC"), and fluorine-containing films such as perfluoro-type high polymers.

Herein, the film composed of SiOx refers to a film that fulfills the following conditions.

That it has O—Si—O as the main skeleton; that the Si and the O are held in a proportion of 60% or more in the whole elements as measured by surface analysis; and that it further has chemical bonds of Si—O and Si—C, where the abundance ratio O/Si of the Si and O is 1.00 or more to 1.95 or less and the abundance ratio C/Si of the Si and C is 0.05 or more to 1.00 or less.

The DLC is a generic term of carbon having high hardness, electrical insulating properties and infrared light transmission properties. Stated specifically, it means carbon of amorphous structure having carbon as the main skeleton and also containing some hydrogen, where both the bonds of a diamond bond ($Sp^3$ bond) and a graphite bond are mixedly present.

As the thickness of the film, it may preferably be in a thickness of from 15 nm or more to 5,000 nm or less from the viewpoints of protecting the elastic layer from wearing and of lessening any exudation from the elastic layer, and more preferably from 300 nm or more to 3,000 nm or less from the viewpoint of exudation preventive properties. Inasmuch as the film is formed in a thickness of 15 nm or more, the film is sufficiently formed and a uniform film can be formed with ease. Inasmuch as the film is formed in a thickness of 5,000 nm or less, the time for forming the film can be shortened to bring an improvement in productivity and the film can have rigidity in a suitable range.

The developing roller produced by using the above materials and conductive substance may preferably have a volume resistivity of from $1\times10^4$ Ω·cm or more to $1\times10^{14}$ Ω·cm or less. Inasmuch as the developing roller has a volume resistivity of $1\times10^4$ Ω·cm or more, faulty images coming from leakage of electric current can be prevented with ease. Inasmuch as the developing roller has a volume resistivity of $1\times10^{14}$ Ω·cm or less, faulty images such as density shortage of solid images can be kept from occurring.

Figure 3:
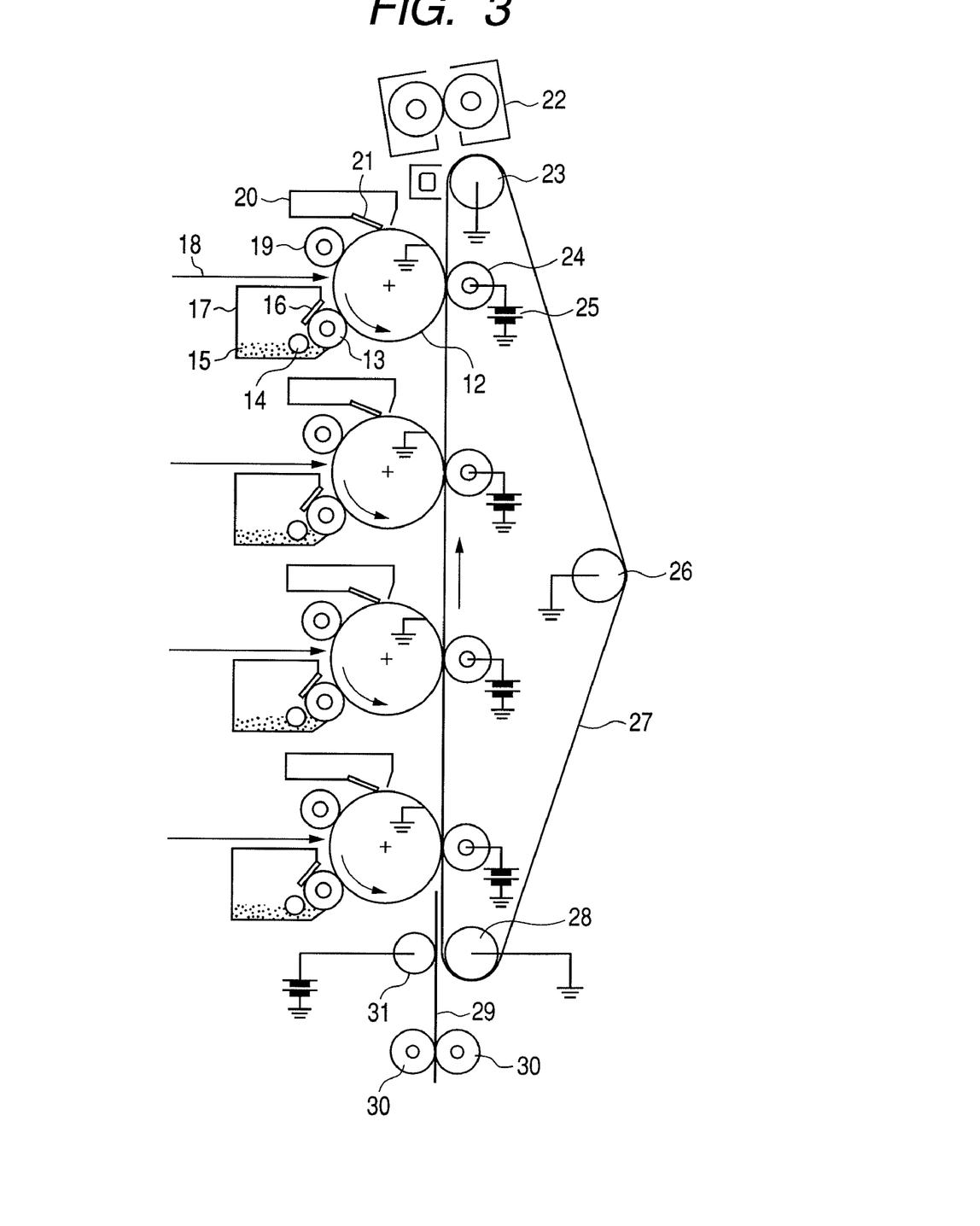
FIG. 3 is a sectional view schematically showing the construction of an example of an electrophotographic image forming apparatus having the developing roller produced by the process of the present invention.

An electrophotographic image forming apparatus and an electrophotographic process cartridge which have the developing roller obtained by the above production process of the present invention are described next with reference to FIG. 3. FIG. 3 is a sectional view schematically showing the construction of an example of an electrophotographic image forming apparatus having the developing roller obtained by the production process of the present invention.

In the electrographic image forming apparatus, each photosensitive drum 12 serving as a latent image bearing member is rotated in the direction of an arrow, and is uniformly charged by means of a charging member 19 which is to charge the photosensitive drum 12 electrostatically. Then the photosensitive drum 12 is exposed to laser light 18, an exposure means which is to write electrostatic latent images to the photosensitive drum 12, to form the electrostatic latent images on the surface of the photosensitive drum. The electrostatic latent images thus formed are provided with a toner 15 by means of a developing assembly 17 the developing roller of which is disposed in contact with the photosensitive drum 12, so that the latent images are developed and rendered visible as toner images.

The development is performed by what is called the reverse development that forms the toner images at exposed areas. The toner images on the photosensitive drum 12 which have been formed by rendering the latent images visible are transferred to a recording medium paper sheet 29 by means of a transfer member transfer roller 24. The paper sheet 29 to which the toner images have been transferred is fixed by means of a fixing assembly 22, and then delivered out of the apparatus, thus the operation of printing is completed.

Meanwhile, a transfer residual toner having remained on the photosensitive drum 12 without being transferred therefrom is scraped off with a cleaning member cleaning blade 21 which is to clean the photosensitive drum 12 surface, and is received in a waste toner container 20. On the photosensitive drum 12 thus cleaned, the above operation is repeated.

The developing assembly 17 has a developer container holding therein a non-magnetic toner serving as a one-component developer, and a developing roller 13 serving as a toner carrying member which is positioned at an opening extending in the lengthwise direction inside the developer container and is provided opposingly to the photosensitive drum 12. In the electrographic image forming apparatus shown in FIG. 3, it is so designed that the electrostatic latent images formed on the photosensitive drum 12 are developed by means of this developing roller 13 to render them visible. In FIG. 3, reference numeral 27 denotes a transfer transport belt which is to transport the paper sheet 29. Reference numerals 23, 26 and 28 denote a drive roller, a tension roller and a follower roller, respectively, which are used to rotate the transfer transport belt 27. Reference numeral 25 denotes a bias power source. Further, reference numerals 30 denote paper feed rollers which feed the paper sheet 29 from a paper feed cassette (not shown). Reference numeral 31 denotes an attraction roller for electrostatically attracting the paper sheet 29 fed by the paper feed roller 30, so as to be held on the transfer transport belt 27.

Figure 4:
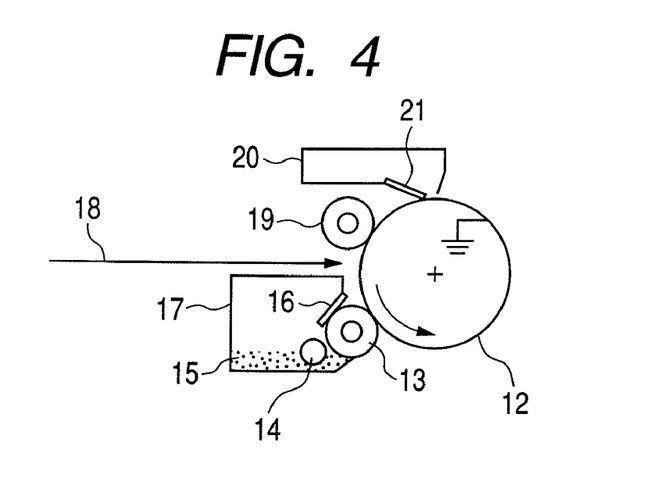
FIG. 4 is a sectional view schematically showing the construction of an example of an electrophotographic process cartridge having the developing roller produced by the process of the present invention.

FIG. 4 is a sectional view schematically showing the construction of an example of an electrophotographic process cartridge having the developing roller obtained by the production process of the present invention. The process cartridge shown in FIG. 4 has a developing assembly 17 having a developing roller 13 and a control blade 16. It also has at least one of a toner coating member 14 and a charging assembly 19. The cartridge holds these integrally therein, and is detachably mountable to the main body of the image forming apparatus.

The toner coating member 14 may be so structured as to have a foamed skeletal spongy structure or a fur brush structure wherein fibers of rayon, polyamide or the like have been set on a shaft mandrel. Such a member is preferred in view of the feeding of the toner to, and the scraping of toner not participated in development off, the developing roller 13. For example, an elastic roller having a shaft mandrel and provided thereon a polyurethane foam may be used as the toner coating member 14.

EXAMPLES

The present invention is described below in greater detail by giving Examples. The present invention is by no means limited by these Examples.

The measurement of the thickness of the elastic layer of each roller base member obtained in the present Examples and the modulus in tension and coefficient of linear expansion of the elastic layer thereof, and also the measurement of the thickness of the film of each developing roller obtained in the present Examples, the evaluation of film forming performance and dimensional stability and the component analysis of the film surface were made in the following way.

Thickness of Elastic Layer

The thickness of the elastic layer of each roller base member obtained in the present Examples was measured in the following way. The difference in radius between the roller base member and the conductive mandrel was measured as the thickness of the elastic layer, using ZAIZAX RVF 600A (trade name; manufactured by Tokyo Seimitsu Co., Ltd.).

Modulus in Tension of the Elastic Layer

The modulus in tension of the elastic layer of each roller base member in the present Examples was measured according to the method prescribed in JIS K 7113. TENSILON RTC-1250A (trade name; manufactured by Orientec Co., Ltd.) was used as a tensile tester. From each roller base member obtained in the present Examples, a roller half-circumference part of an elastic layer of 100 mm in length, having the shape shown in FIG. 5A, was sampled and was used as a test sample 32 for measuring the modulus in tension. The test sample was, by 10 mm at both end portions thereof, attached to chucks of the tensile tester. The modulus in tension was measured under conditions of a chuck-to-chuck length of 80 mm and a measuring rate of 20 mm/min and in a measuring environment set at a temperature of 20° C. and a relative humidity of 50%. This was measured five times, and an average value of the moduli in tension was regarded as the modulus in tension of the elastic layer.

Coefficient of Linear Expansion of Elastic Layer

The coefficient of linear expansion of the elastic layer of each roller base member obtained in the present Examples was measured in the following way.

From each roller base member obtained in the present Examples, a roller full-circumference part of a elastic layer of 20 mm in length, having the shape shown in FIG. 5B, was extracted and was used as a test sample 33 for measuring the coefficient of linear expansion. This test sample was attached to a thermomechanical analyzer TMA-60 (trade name; manufactured by Shimadzu Corporation), and was heated from 23° C. to 50° C. at a heating rate of 5° C./min in an atmosphere of nitrogen, where the coefficient of linear expansion was determined from the thermal linear-expansion curve obtained.

Measurement was made five times, and an average value of the measurements was regarded as the coefficient of linear expansion of the elastic layer.

Thickness of Film & Film Forming Performance

The thickness of the film of each developing roller obtained in the present Examples was measured in the following way. The thickness of the film of each developing roller obtained in the present Examples was measured with a thin-film measuring instrument F20-EXR (trade name; manufactured by Filmetrics Japan, Inc.). The thickness of the film of the developing roller at three spots divided equally in its lengthwise direction and at three spots divided equally in its peripheral direction, at nine spots in total, was measured in a measuring environment of a temperature of 20° C. and a relative humidity of 50%. An average value of the values found was regarded as the thickness of the film. How the film was formed was also observed on a digital microscope VHX-500 (trade name; manufactured by Keyence Corporation). The state of the film formed was observed to determine the area of coverage, and the film forming performance was evaluated according to the following criteria.

5: The film stands formed, and the scattering of the layer thickness is 10% or less as the value of maximum value/minimum value.

4: The film stands formed, and the scattering of the layer thickness is 20% or less as the value of maximum value/minimum value.

3: The film stands formed, and the scattering of the layer thickness is 30% or less as the value of maximum value/minimum value.

2: The film stands formed, but the film is not smooth and has unevenness, and the scattering of the layer thickness is more than 30% as the value of maximum value/minimum value.

1: The film does not stand formed, and the developing roller is not covered with film over the range of 10% or more of its surface area.

Component Analysis of Film Surface

The Component analysis of the film surface of each developing roller obtained in the present Examples was made using an X-ray photoelectron spectrometer QUANTUM 2000 (trade name; manufactured by ULVAC-PHI Inc.). ALKα was used as an X-ray source, and element abundance ratios O/Si and C/Si were determined.

The following evaluation was made on the developing rollers obtained in the present Examples.

-Dimensional Stability-

The roundness in shape, and run-out, of each developing roller obtained in the present Examples were measured in the following way to make evaluation. The measurement environment was set at a temperature of 20° C. and a relative humidity of 60%.

Roundness

As to the roundness, it was measured on 100 developing rollers by using a roundness and cylindricalness measuring instrument ROUND TEST RA-726 (trade name; manufactured by Mitutoyo Corporation), and an average value of the measurements was regarded as the roundness.

5: The value of roundness maximum value—roundness minimum value is 10 µm or less, which is very good and is best as the roundness of the developing roller.

4: The value of roundness maximum value—roundness minimum value is more than 10 µm to 20 µm or less, which is good and is of no problem in practical use.

3: The value of roundness maximum value—roundness minimum value is more than 20 µm to 30 µm or less, which is on a level where the roller is usable as the developing roller.

2: The value of roundness maximum value—roundness minimum value is more than 30 µm to less than 40 µm, and the roller has a problem in practical use as the developing roller.

1: The value of roundness maximum value—roundness minimum value is 40 µm or more, and the roller has a difficulty in its use as the developing roller.

Run-Out

As to the run-out, it was measured with an outer-diameter and run-out measuring instrument LASER SCAN MICROMETER (trade name; manufactured by Mitutoyo Corporation), and the largest value in the lengthwise direction among values of run-out was regarded as the run-out of the roller. Values found by measurement on 100 rollers were averaged to regard the value as the run-out.

5: The run-out is 20 µm or less, which is very good and is best as the developing roller.

4: The run-out is more than 20 µm to 30 µm or less, which is of no problem in practical use.

3: The run-out is more than 30 µm to 40 µm or less, which is on a level where the roller is usable as the developing roller.

2: The run-out is more than 40 µm to 45 µm or less, and the roller has a problem in practical use.

1: The run-out is more than 45 µm, and the roller has a difficulty in its use as the developing roller.

As for raw-materials, commercially available high-purity products were used unless particularly noted in the present Examples.

Example 1

Formation of Elastic Layer

The following materials were kneaded by means of a twin-screw extruder having an orifice diameter (D) of 30 mm, an orifice length (L) of 960 mm and L/D of 32, to prepare pellets for a thermoplastic resin composition.

Thermoplastic resin (dynamically cross-linked thermoplastic resin; represented as TPV) (trade name: SANTOPRENE 8211-35; available from A.E.S. Japan Co.): 100 parts by mass.

Process oil (trade name: PW380; available from Idemitsu Kosan Co., Ltd.): 30 parts by mass.

Conducting agent (MT carbon black; trade name: THERMAX FLOFORM N990; available from Cancarb): 30 parts by mass.

Using an extruder connected with a crosshead, the above pellets were melt-extruded to form an elastic layer on the peripheral surface of a conductive mandrel (made of SUM stainless steel; diameter: 6 mm; length: 240 mm) having been subjected to primer treatment (trade name: Chemlok 459X; available from LORD Corporation). The elastic layer was cut at both end portions thereof to remove them, and was provided with bearing parts on both the end portions. Thus, the elastic layer portion was set being 232 mm in length in the shaft mandrel direction. Thereafter, this elastic layer portion was grounded with a rotary grinding stone to obtain a roller base member having an elastic layer of 12 mm in diameter and 3.0 mm in thickness.

The thickness of the elastic layer of the roller base member obtained and the modulus in tension and coefficient of linear expansion of the elastic layer were measured by the methods described previously. The results of measurement are shown in Table 1.

Formation of Film

Figure 1:
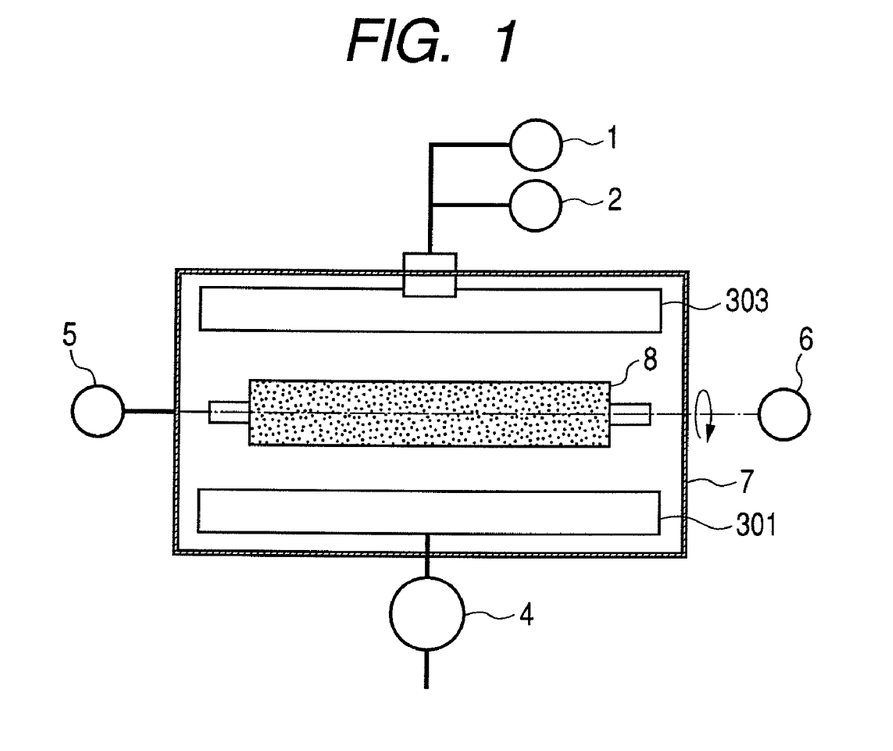
FIG. 1 is a sectional view schematically showing the construction of an example of a high-frequency plasma CVD system in the present invention.

The high-frequency plasma CVD system set up as shown in FIG. 1 was readied. The flat-plate electrodes 301 and 303 were made of stainless steel (SUS316), having a rectangular shape of 300 mm in length (length in the right-and-left direction as viewed in FIG. 1) and 20 mm in width. These flat-plate electrodes were so placed in the chamber in parallel to each other as to be 112 mm in distance between them. Next, the roller base member obtained in the manner described above was placed between the flat-plate electrodes 301 and 303. Here, it was placed in such a way that the rotating shaft of the roller base member and the surfaces of the flat-plate electrodes were in parallel to one another and also the distance between the processing surface of the roller base member and the flat-plate electrode 301 (the shortest distance between the electrode surface on the side of power application and the roller base member processing surface) was 50 mm. Thereafter, the inside of the chamber was evacuated to 1.0 Pa by means of a vacuum pump. Next, a mixed gas of 1.0 sccm of hexamethyldisiloxane vapor, 1.5 sccm of oxygen and 22.5 sccm of argon gas was fed into the chamber. Here, "sccm" represents the volume flow rate of the source gas in 1 $cm^3$ per minute at a temperature of 0° C. under an atmospheric pressure of 1. The pressure of the reaction gas inside the chamber was so controlled as to come to 25.3 Pa.

After the pressure inside the chamber became constant, an electric power of 13.56 MHz in frequency and 120 W was applied to the flat-plate electrode 301 through a high-frequency power source to supply an electric power of 1 $W/cm^2$ in output to cause plasma to take place between the flat-plate electrodes 301 and 303. The roller base member placed in the chamber was so rotated that the peripheral speed of its processing surface was 30 mm/second, where the processing was carried out for 3 minutes. After the processing was completed, the electric power was stopped being applied and then air was fed into the chamber until the pressure came to atmospheric pressure, where a developing roller was taken out which had the film thus formed. This developing roller was evaluated on the above various items.

The ratios of number of atoms, O/Si and C/Si, of elements at the film surface of the developing roller according to this Example were also determined by the component analysis described previously, to find that they were 1.56 and 0.32, respectively, thus the film was an SiOx film. The film was 1,000 nm in thickness. Film forming conditions for the film are shown in Table 2. The results of evaluation of the developing roller obtained are shown in Table 3.

Example 2

A roller base member was produced in the same way as in Example 1 except that the conducting agent was used in an amount of 50 parts by mass and talc was further used in an amount of 50 parts by mass as a filler. Using this roller base member, a developing roller was produced in the same way as in Example 1. Physical properties of the elastic layer, film forming conditions for the film and the results of evaluation on the developing roller obtained are shown in Tables 1 to 3, respectively. Here, the film was in a thickness of 1,000 nm.

Example 3

A roller base member was produced in the same way as in Example 1 except that the process oil was used in an amount of 100 parts by mass. Using this roller base member, a developing roller was produced in the same way as in Example 1. Physical properties of the elastic layer, film forming conditions for the film and the results of evaluation on the developing roller obtained are shown in Tables 1 to 3, respectively. Here, the film was in a thickness of 1,000 nm.

Example 4

A roller base member was produced in the same way as in Example 1. Using this roller base member, a developing roller was obtained in the same way as in Example 1 except that the hexamethyldisiloxane vapor as a source gas was changed for toluene vapor and the argon gas was fed in an amount changed to 24.0 sccm to form the film as a DLC film. Physical properties of the elastic layer, film forming conditions for the film and the results of evaluation of the developing roller obtained are shown in Tables 1 to 3, respectively. Here, the film was in a thickness of 1,020 nm.

Example 5

The following raw materials for the elastic layer were kneaded by means of a 10-liter kneader, and thereafter, with addition of the following vulcanization accelerator and vulcanizing agent, further kneaded by means of a twin roll to prepare a rubber composition.

Rubber (NBR; trade name: N235S; available from JSR Corporation; acrylonitrile: 36 wt. %): 100 parts by mass.

Conducting agent (MT carbon black; trade name: THERMAX FLOFORM N990; available from Cancarb): 50 parts by mass.

Filler (zinc oxide): 5 parts by mass.
Processing aid (stearic acid): 1 part by mass.
Vulcanizing agent (sulfur): 1 part by mass.
Vulcanization accelerator (mercaptobenzothiazole): 1 part by mass.

A roller base member was produced in the same way as in Example 1 except that this rubber composition was used. Using this roller base member, a developing roller was obtained in the same way as in Example 1. Physical properties of the elastic layer, film forming conditions for the film and the results of evaluation on the developing roller obtained are shown in Tables 1 to 3, respectively. Here, the film was in a thickness of 1,000 nm.

Example 6

A roller base member was produced in the same way as in Example 1 except that the thermoplastic resin was changed for an ethylene-vinyl acetate copolymer resin EV170 (trade name; available from Du Pont Mitsui Polychemicals Co., Ltd.; represented as EVA in Table 1). Using this roller base member, a developing roller was obtained in the same way as in Example 1. Physical properties of the elastic layer, film forming conditions for the film and the results of evaluation on the developing roller obtained are shown in Tables 1 to 3, respectively. Here, the film was in a thickness of 1,000 nm.

Example 7

A roller base member was produced in the same way as in Example 1 except that the conductive mandrel was changed for a conductive mandrel of 11.0 mm in diameter and the elastic layer was formed in a thickness of 0.5 mm. Using this roller base member, a developing roller was obtained in the same way as in Example 1. Physical properties of the elastic layer, film forming conditions for the film and the results of evaluation on the developing roller obtained are shown in Tables 1 to 3, respectively. Here, the film was in a thickness of 1,000 nm.

Example 8

A roller base member was produced in the same way as in Example 1 except that the conductive mandrel was changed for a conductive mandrel of 2.0 mm in diameter and the elastic layer was formed in a thickness of 5.0 mm. Using this roller base member, a developing roller was obtained in the same way as in Example 1. Physical properties of the elastic layer, film forming conditions for the film and the results of evaluation on the developing roller obtained are shown in Tables 1 to 3, respectively. Here, the film was in a thickness of 1,000 nm.

Example 9

A roller base member was produced in the same way as in Example 1 except that the process oil was used in an amount changed to 150 parts by mass, and the conducting agent, 10 parts by mass. Using this roller base member, a developing roller was obtained in the same way as in Example 1. Physical properties of the elastic layer, film forming conditions for the film and the results of evaluation on the developing roller obtained are shown in Tables 1 to 3, respectively. Here, the film was in a thickness of 1,000 nm.

Example 10

A roller base member was produced in the same way as in Example 1 except that the thermoplastic resin was changed for a dynamically cross-linked thermoplastic resin (represented as TPV) (SANTOPRENE 8211-87, trade name; available from A.E.S. Japan Co.) and the process oil was used in an amount changed to 0 part by mass. Then, using this roller base member, a developing roller was obtained in the same way as in Example 1. Physical properties of the elastic layer, film forming conditions for the film and the results of evaluation on the developing roller obtained are shown in Tables 1 to 3, respectively. Here, the film was in a thickness of 1,000 nm.

Example 11

A developing roller was obtained in the same way as in Example 1 except that the pressure of the reaction gas in the vacuum chamber was changed to 13.3 Pa. Physical properties of the elastic layer, film forming conditions for the film and the results of evaluation on the developing roller obtained are shown in Tables 1 to 3, respectively. The film was in a thickness of 800 nm.

Example 12

A developing roller was obtained in the same way as in Example 1 except that the pressure of the reaction gas in the vacuum chamber was changed to 666.6 Pa. Physical properties of the elastic layer, film forming conditions for the film and the results of evaluation on the developing roller obtained are shown in Tables 1 to 3, respectively. The film was in a thickness of 1,100 nm.

Example 13

A developing roller was obtained in the same way as in Example 1 except that the peripheral speed of the processing surface of the roller base member was changed to 6.0 mm/s. Physical properties of the elastic layer, film forming conditions for the film and the results of evaluation on the developing roller obtained are shown in Tables 1 to 3, respectively. Here, the film was in a thickness of 1,000 nm.

Example 14

A developing roller was obtained in the same way as in Example 1 except that the peripheral speed of the processing surface of the roller base member was changed to 170.0 mm/s. Physical properties of the elastic layer, film forming conditions for the film and the results of evaluation on the developing roller obtained are shown in Tables 1 to 3, respectively. Here, the film was in a thickness of 1,000 nm.

Example 15

A developing roller was obtained in the same way as in Example 1 except that the output was so controlled as to come to 0.3 W/cm$^2$. Physical properties of the elastic layer, film forming conditions for the film and the results of evaluation on the developing roller obtained are shown in Tables 1 to 3, respectively. Here, the film was in a thickness of 800 nm.

Example 16

A developing roller was obtained in the same way as in Example 1 except that the output was so controlled as to come to 2.0 W/cm$^2$. Physical properties of the elastic layer, film forming conditions for the film and the results of evaluation on the developing roller obtained are shown in Tables 1 to 3, respectively. Here, the film was in a thickness of 1,100 nm.

Example 17

A developing roller was obtained in the same way as in Example 1 except that the flat-plate electrodes were so placed in the chamber in parallel as to be 52 mm in distance between them and the distance between the electrodes and the roller base member was changed to 20 mm. Physical properties of the elastic layer, film forming conditions for the film and the results of evaluation on the developing roller obtained are shown in Tables 1 to 3, respectively. Here, the film was in a thickness of 1,100 nm.

Example 18

A developing roller was obtained in the same way as in Example 1 except that the flat-plate electrodes were so placed in the chamber in parallel as to be 212 mm in distance between them and the distance between the electrodes and the roller base member was changed to 100 mm. Physical properties of the elastic layer, film forming conditions for the film and the results of evaluation on the developing roller obtained are shown in Tables 1 to 3, respectively. Here, the film was in a thickness of 800 nm.

Comparative Example 1

A developing roller was obtained in the same way as in Example 1 except that the pressure of the reaction gas was changed to 6.66 Pa. Physical properties of the elastic layer, film forming conditions for the film and the results of evaluation on the developing roller obtained are shown in Tables 1 to 3, respectively. The film was in a thickness of 700 nm.

Comparative Example 2

A developing roller was obtained in the same way as in Example 1 except that the pressure of the reaction gas was changed to 733.3 Pa. Physical properties of the elastic layer, film forming conditions for the film and the results of evaluation on the developing roller obtained are shown in Tables 1 to 3, respectively. The film was in a thickness of 1,500 nm.

Comparative Example 3

A developing roller was obtained in the same way as in Example 1 except that the peripheral speed of the processing surface of the roller base member was changed to 5.0 mm/s. Physical properties of the elastic layer, film forming conditions for the film and the results of evaluation on the developing roller obtained are shown in Tables 1 to 3, respectively. The film was in a thickness of 1,000 nm.

Comparative Example 4

A developing roller was obtained in the same way as in Example 1 except that the peripheral speed of the processing surface of the roller base member was changed to 180 mm/s. Physical properties of the elastic layer, film forming conditions for the film and the results of evaluation on the developing roller obtained are shown in Tables 1 to 3, respectively. The film was in a thickness of 1,000 nm.

Comparative Example 5

A developing roller was obtained in the same way as in Example 1 except that the output was changed to 0.2 W/cm². Physical properties of the elastic layer, film forming conditions for the film and the results of evaluation on the developing roller obtained are shown in Tables 1 to 3, respectively. The film was in a thickness of 600 nm.

Comparative Example 6

A developing roller was obtained in the same way as in Example 1 except that the output was changed to 2.5 W/cm². Physical properties of the elastic layer, film forming conditions for the film and the results of evaluation on the developing roller obtained are shown in Tables 1 to 3, respectively. The film was in a thickness of 1,500 nm.

Comparative Example 7

A developing roller was obtained in the same way as in Example 1 except that the flat-plate electrodes were so placed in the chamber in parallel as to be 42 mm in distance between them and the distance between the electrodes and the roller base member was changed to 15 mm. Physical properties of the elastic layer, film forming conditions for the film and the results of evaluation on the developing roller obtained are shown in Tables 1 to 3, respectively. The film was in a thickness of 1,300 nm.

Comparative Example 8

A developing roller was obtained in the same way as in Example 1 except that the flat-plate electrodes were so placed in the chamber in parallel as to be 232 mm in distance between them and the distance between the electrodes and the roller base member was changed to 110 mm. Physical properties of the elastic layer, film forming conditions for the film and the results of evaluation on the developing roller obtained are shown in Tables 1 to 3, respectively. The film was in a thickness of 600 nm.

TABLE 1

| | Elastic layer | | | |
|---|---|---|---|---|
| | Material | Thickness (mm) | Modulus in tension (MPa) | Coefficient of linear expansion ($\times 10^{-4}$/° C.) |
| Example: | | | | |
| 1 | TPV | 3.00 | 10 | 0.7 |
| 2 | TPV | 3.00 | 10 | 0.5 |
| 3 | TPV | 3.00 | 10 | 5.0 |
| 4 | TPV | 3.00 | 10 | 0.7 |
| 5 | NBR | 3.00 | 10 | 0.7 |
| 6 | EVA | 3.00 | 12 | 0.7 |
| 7 | TPV | 0.50 | 10 | 0.7 |
| 8 | TPV | 5.00 | 10 | 0.7 |
| 9 | TPV | 3.00 | 1 | 5.1 |
| 10 | TPV | 3.00 | 100 | 0.1 |
| 11 | TPV | 3.00 | 10 | 0.7 |
| 12 | TPV | 3.00 | 10 | 0.7 |
| 13 | TPV | 3.00 | 10 | 0.7 |
| 14 | TPV | 3.00 | 10 | 0.7 |
| 15 | TPV | 3.00 | 10 | 0.7 |
| 16 | TPV | 3.00 | 10 | 0.7 |
| 17 | TPV | 3.00 | 10 | 0.7 |
| 18 | TPV | 3.00 | 10 | 0.7 |
| Comparative Example: | | | | |
| 1 | TPV | 3.00 | 10 | 0.7 |
| 2 | TPV | 3.00 | 10 | 0.7 |
| 3 | TPV | 3.00 | 10 | 0.7 |
| 4 | TPV | 3.00 | 10 | 0.7 |
| 5 | TPV | 3.00 | 10 | 0.7 |
| 6 | TPV | 3.00 | 10 | 0.7 |
| 7 | TPV | 3.00 | 10 | 0.7 |
| 8 | TPV | 3.00 | 10 | 0.7 |

TABLE 2

| | Film | | | | | |
|---|---|---|---|---|---|---|
| | Film chief component | Source gas pressure (Pa) | Peripheral speed (mm/sec) | Output (W/cm²) | Processing temp. (° C.) | Distance between first electrode and processing surface (mm) |
| Example: | | | | | | |
| 1 | SiOx | 40.0 | 30 | 1.0 | 70 | 50 |
| 2 | SiOx | 40.0 | 30 | 1.0 | 70 | 50 |
| 3 | SiOx | 40.0 | 30 | 1.0 | 70 | 50 |
| 4 | DLC | 40.0 | 30 | 1.0 | 70 | 50 |
| 5 | SiOx | 40.0 | 30 | 1.0 | 70 | 50 |
| 6 | SiOx | 40.0 | 30 | 1.0 | 70 | 50 |
| 7 | SiOx | 40.0 | 30 | 1.0 | 70 | 50 |
| 8 | SiOx | 40.0 | 30 | 1.0 | 70 | 50 |
| 9 | SiOx | 40.0 | 30 | 1.0 | 70 | 50 |
| 10 | SiOx | 40.0 | 30 | 1.0 | 70 | 50 |
| 11 | SiOx | 13.3 | 30 | 1.0 | 70 | 50 |
| 12 | SiOx | 666.6 | 30 | 1.0 | 70 | 50 |
| 13 | SiOx | 40.0 | 6 | 1.0 | 70 | 50 |
| 14 | SiOx | 40.0 | 170 | 1.0 | 70 | 50 |
| 15 | SiOx | 40.0 | 30 | 0.3 | 70 | 50 |
| 16 | SiOx | 40.0 | 30 | 2.0 | 70 | 50 |
| 17 | SiOx | 40.0 | 30 | 1.0 | 70 | 20 |
| 18 | SiOx | 40.0 | 30 | 1.0 | 70 | 100 |
| Comparative Example: | | | | | | |
| 1 | SiOx | 6.7 | 30 | 1.0 | 70 | 50 |
| 2 | SiOx | 733.3 | 30 | 1.0 | 70 | 50 |
| 3 | SiOx | 40.0 | 5 | 1.0 | 70 | 50 |
| 4 | SiOx | 40.0 | 180 | 1.0 | 70 | 50 |
| 5 | SiOx | 40.0 | 30 | 0.2 | 70 | 50 |
| 6 | SiOx | 40.0 | 30 | 2.5 | 70 | 50 |
| 7 | SiOx | 40.0 | 30 | 1.0 | 70 | 15 |
| 8 | SiOx | 40.0 | 30 | 1.0 | 70 | 110 |

TABLE 3

| | Roundness | Run-out | Film forming performance |
|---|---|---|---|
| Example: | | | |
| 1 | 5 | 5 | 5 |
| 2 | 5 | 5 | 5 |
| 3 | 4 | 4 | 3 |
| 4 | 5 | 5 | 5 |
| 5 | 5 | 5 | 5 |

TABLE 3-continued

| | Roundness | Run-out | Film forming performance |
|---|---|---|---|
| 6 | 4 | 4 | 3 |
| 7 | 3 | 3 | 5 |
| 8 | 3 | 3 | 5 |
| 9 | 3 | 3 | 3 |
| 10 | 5 | 5 | 4 |
| 11 | 5 | 5 | 3 |
| 12 | 5 | 5 | 3 |
| 13 | 3 | 3 | 3 |
| 14 | 3 | 3 | 5 |
| 15 | 3 | 3 | 3 |
| 16 | 3 | 3 | 4 |
| 17 | 5 | 5 | 3 |
| 18 | 5 | 5 | 3 |
| Comparative Example: | | | |
| 1 | 3 | 3 | 2 |
| 2 | 5 | 5 | 2 |
| 3 | 2 | 2 | 2 |
| 4 | 2 | 2 | 3 |
| 5 | 2 | 2 | 1 |
| 6 | 2 | 2 | 3 |
| 7 | 5 | 5 | 1 |
| 8 | 5 | 5 | 1 |

Next, using the developing rollers according to the above Examples 1 to 18, the following evaluations were made. The results are shown in Table 4.

Toner Deterioration

An electrophotographic process cartridge (trade name: CRG-311 BLK; manufactured by CANON INC.) was prepared in which each of the developing rollers obtained in the respective Examples was set. This electrophotographic process cartridge was mounted to the main body of a color laser printer (trade name: SATERA LBP 5400; manufactured by CANON INC.). Under high-temperature and high-humidity conditions of a temperature of 30° C. and a relative humidity of 80%, images of a 1%-printed material were continuously printed on 3,500 sheets at a printing speed of 20 ppm, using A4-size sheets (trade name: CANON COLOR LASER COPIER PAPER; basis weight: 81.4 g/m$^2$; thickness: 92 μm; whiteness: 92%). Subsequently thereto, a solid white image was printed on 1 sheet, and whether or not any fog appeared on the solid white image was visually examined. On the basis of the results obtained, evaluation was made on toner deterioration according to the following criteria.

5: Any fog due to toner deterioration is not seen with the naked eye.

4: Fog due to toner deterioration is low enough to be of no problem in practical use.

3: Fog due to toner deterioration is seen, but at a level acceptable to practical use.

2: Fog due to toner deterioration is seen, and there is a problem in practical use.

1: Serious fog is seen, showing a great toner deterioration.

Set Properties

Each developing roller obtained in the present Examples was set in an electrophotographic process cartridge (trade name: CRG-311 BLK; manufactured by CANON INC.). This was left to stand for 30 days in a thermostatic chamber (temperature: 40° C.; relative humidity: 95%) having a severe high-temperature and high-humidity environment. Thereafter, this was moved to an environment of a temperature of 20° C. and a relative humidity of 50% and left to stand there for a day, and then this electrophotographic process cartridge was mounted to the main body of a color laser printer LBP 5400 (trade name; manufactured by CANON INC.) to print halftone images. Images obtained were visually examined, and any effects of roller pressure contact marks on the images were evaluated according to the following criteria. Here, images having a density of 0.7 as measured with a densitometer (trade name: MACBETH COLOR CHECKER RD-1255; manufactured by Gretag Machbeth Ag.) were used as the halftone images.

5: Any faulty images due to roller pressure contact marks are not seen.

4: Faulty images due to roller pressure contact marks are very slightly seen, but not having affected the images.

3: Roller pressure contact marks are slightly seen, but faulty images are low enough to be of no problem in practical use.

2: Roller pressure contact marks are seen and faulty images are seen, having a problem in practical use.

1: Images have a plain problem because of roller pressure contact marks, and can not serve for practical use.

Image Evaluation

Each developing roller obtained in the present Examples was set in an electrophotographic process cartridge (trade name: CRG-311 BLK; manufactured by CANON INC.). This was mounted to the main body of a color laser printer LBP 5400 (trade name; manufactured by CANON INC.) to reproduce the same halftone images as the above on 100 sheets in an environment of a temperature of 20° C. and a relative humidity of 50% and using a non-magnetic one-component black toner. Images obtained were visually examined to synthetically ascertain whether or not any faulty images appeared thereon, to make judgment on practicality and make evaluation according to the following criteria. Here, images having a density of 0.7 as measured with a densitometer MACBETH COLOR CHECKER RD-1255 (trade name; manufactured by Gretag Machbeth Ag.) were used as the halftone images.

5: Any faulty images are not seen.

4: Faulty images are little seen.

3: Faulty images are seen which are at a level of no problem in practical use.

2: Faulty images are seen, which have a problem in practical use.

1: Images have a plain problem, and can not serve for practical use.

Exudation

Each developing roller obtained in the present Examples was left to stand for a month in an environment tester kept at a temperature of 40° C. and a relative humidity of 95%, and thereafter any exudation to the developing roller surface was visually examined. Further, this developing roller was set in an electrophotographic process cartridge (trade name: CRG-311 BLK; manufactured by CANON INC.). This was mounted to the main body of a color laser printer LBP 5400 (trade name; manufactured by CANON INC.) to reproduce the same halftone images as the above in an environment of a temperature of 20° C. and a relative humidity of 50%. Images obtained were visually examined to ascertain any effects on the images to make evaluation on the exudation according to the following criteria. Here, images having a density of 0.7 as measured with a densitometer MACBETH COLOR CHECKER RD-1255 (trade name; manufactured by Gretag Machbeth Ag.) were used as the halftone images.

5: Any exudation is not seen on the developing roller surface, also not having any effect on the images.

4: Exudation is slightly seen on the developing roller surface, but there is no problem on the images.

3: Exudation is seen on the developing roller surface and image defects are slightly seen on the images, but there is no problem in practical use.

2: Exudation is seen on the developing roller surface, image defects are seen on the images, and there is a problem in practical use.

1: Exudation is greatly seen on the developing roller surface, not servable for practical use.

TABLE 4

| Example: | Toner deterioration | Image evaluation | Set properties | Exudation |
|---|---|---|---|---|
| 1 | 5 | 5 | 5 | 5 |
| 2 | 5 | 3 | 5 | 5 |
| 3 | 5 | 3 | 5 | 5 |
| 4 | 5 | 5 | 5 | 3 |
| 5 | 5 | 5 | 5 | 5 |
| 6 | 5 | 5 | 3 | 5 |
| 7 | 3 | 5 | 5 | 5 |
| 8 | 5 | 5 | 5 | 5 |
| 9 | 5 | 5 | 5 | 5 |
| 10 | 4 | 5 | 5 | 5 |
| 11 | 5 | 3 | 5 | 5 |
| 12 | 5 | 3 | 5 | 5 |
| 13 | 5 | 5 | 5 | 5 |
| 14 | 5 | 5 | 5 | 5 |
| 15 | 5 | 5 | 5 | 5 |
| 16 | 5 | 5 | 5 | 5 |
| 17 | 5 | 3 | 5 | 5 |
| 18 | 5 | 3 | 5 | 5 |

It can be seen from these results that the films of the roller members according to Examples 1 to 18 afford performances well durable for practical use as developing rollers.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims priority from Japanese Patent Application No. 2007-118783, filed on Apr. 27, 2007, the content of which is herein incorporated by reference.

What is claimed is:

1. A process for producing an electrophotographic roller member comprising a roller base member having a conductive mandrel and an elastic layer formed on the peripheral surface of the conductive mandrel, the elastic layer having a thickness of from 0.5 to 5.0 mm and a modulus in tension of from 1 to 100 MPa, and a film formed by plasma CVD on the peripheral surface of the elastic layer, the process comprising the steps of:
   placing the roller base member in a chamber between first and second flat-plate electrodes which are disposed parallel to each other, with a distance between the surface of the elastic layer and each of the flat-plate electrodes being from 20 to 100 mm;
   feeding a source gas into the chamber so as to have a pressure within the chamber of from 13.3 to 666.6 Pa; and
   applying to the first flat-plate electrode an electric power with an output of from 0.3 to 2.0 W/cm2 while the roller base member is rotated so that the peripheral speed of the surface to be processed is from 6 to 170 mm/s in the chamber into which the source gas has been fed, thereby generating plasma inside the chamber, to form said film on the surface of the elastic layer, wherein
   the film mainly comprises SiOx, where X is 1 or 2, and has O-Si-O as a main skeleton, and Si and O in the film is at least 60% of all elements as measured by surface analysis of the film, and
   the film has chemical bonds of Si-O and Si-C, where the abundance ratio O/Si of the Si and O is from 1.00 to 1.95, and the abundance ratio C/Si of the Si and C is from 0.05 to 1.00.

2. The process according to claim 1, wherein the elastic layer has a coefficient of linear expansion of from $0.5 \times 10^{-4}$ to $5.0 \times 10^{-4}$/°C.

3. The process according to claim 1, wherein the elastic layer comprises a thermoplastic resin composition.

4. The process according to claim 3, wherein the thermoplastic resin composition is dynamically cross-linked.

5. The process according to claim 2, wherein the coefficient of linear expansion is determined within a temperature range of from 23 to 50° C.

* * * * *